(12) United States Patent
Lewis et al.

(10) Patent No.: US 8,440,256 B2
(45) Date of Patent: May 14, 2013

(54) COMBUSTION DEPOSITION OF METAL OXIDE COATINGS DEPOSITED VIA INFRARED BURNERS

(75) Inventors: Mark A. Lewis, Ypsilanti, MI (US); David D. McLean, Hazel Park, MI (US); Maximo Frati, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1547 days.

(21) Appl. No.: 12/000,784

(22) Filed: Dec. 17, 2007

(65) Prior Publication Data

US 2009/0155493 A1 Jun. 18, 2009

(51) Int. Cl.
*B05D 5/06* (2006.01)
*C23C 8/00* (2006.01)

(52) U.S. Cl.
USPC .......... 427/167; 427/162; 427/164; 427/165; 427/166; 427/586

(58) Field of Classification Search .......... 427/160–169
See application file for complete search history.

(56) References Cited

U.S. PATENT DOCUMENTS

| | | | | |
|---|---|---|---|---|
| 3,857,670 A | * | 12/1974 | Karlovetz et al. | 431/329 |
| 4,363,647 A | * | 12/1982 | Bachman et al. | 65/17.4 |
| 4,775,401 A | * | 10/1988 | Fleming et al. | 65/395 |
| 5,101,558 A | | 4/1992 | Grob et al. | |
| 5,249,953 A | * | 10/1993 | Roth | 431/7 |
| 5,652,021 A | | 7/1997 | Hunt et al. | |
| 5,858,465 A | | 1/1999 | Hunt et al. | |
| 6,013,318 A | | 1/2000 | Hunt et al. | |
| 6,094,940 A | * | 8/2000 | Fujiwara et al. | 65/17.4 |
| 6,193,911 B1 | * | 2/2001 | Hunt et al. | 252/518.1 |
| 6,672,109 B1 | * | 1/2004 | Hiraiwa | 65/378 |
| 2002/0083741 A1 | * | 7/2002 | Pandelisev | 65/416 |
| 2006/0127599 A1 | | 6/2006 | Wojak | |
| 2007/0113881 A1 | * | 5/2007 | Mellott et al. | 136/243 |

FOREIGN PATENT DOCUMENTS

| | | |
|---|---|---|
| EP | 974560 A1 * | 1/2000 |
| EP | 2 072 633 | 6/2009 |
| GB | 2 292 468 | 2/1996 |
| JP | 09-286636 | 4/1997 |
| WO | WO 00/44679 | 8/2000 |
| WO | WO 2004/056714 | 7/2004 |

OTHER PUBLICATIONS

"TIE-35: Transmittance of optical glass", Schott, Inc; accessed online Aug. 12, 2011.*

(Continued)

*Primary Examiner* — David Turocy
*Assistant Examiner* — Michael G Miller
(74) *Attorney, Agent, or Firm* — Nixon & Vanderhye P.C.

(57) ABSTRACT

Certain example embodiments of this invention relate to a method of forming a coating on a glass substrate using combustion deposition. A glass substrate having at least one surface to be coated is provided. A reagent is selected. A precursor to be combusted with the reagent is introduced. Using at least one infrared burner, at least a portion of the reagent and the precursor are combusted to form a combusted material, with the combusted material including non-vaporized material. The glass substrate is provided in an area so that the glass substrate is heated sufficiently to allow the combusted material to form the coating, directly or indirectly, on the glass substrate. The coating may be substantially uniform. In certain example embodiments, a silicon oxide coating may be deposited, which increases visible transmission of the glass substrate by at least about 1.7%.

21 Claims, 4 Drawing Sheets

OTHER PUBLICATIONS

"UV Grade Fused Silica Optical Glass", http://www.vpglass.com/optical_glass/uv_grade_fused_silica.html; accessed online Aug. 15, 2011.*
Serway, Raymond A; Beichner, Robert J; Jewett Jr, John W; "Physics for Scientists and Engineers with Modern Physics", 2000, Saunders College Publushing, 5th edition, p. 1093.*
Solomons, "Organic Chemistry", 5$^{th}$ edition, John Wiley and Sons, 1992, pp. 558-561.*
"Combustion Chemical Vapor Deposition: A Novel Thin-Film Deposition Technique", Hunt et al., 1993 American Institute of Physics, Apr. 21, 1993.
"Growth of Thin Films of Molybdenum and Tungsten Oxides by Combustion CVD using Aqueous Precursor Solutions", Davis et al., Chemical Vapor Deposition 2004, 10, No. 1, pp. 29-34.
"Specifications/Design Details" Radiant Energy—source and transfer, Rad/Max Burners Sep. 2002, pp. 1403-1414.

* cited by examiner

COMBUSTION DEPOSITION OF METAL OXIDE COATINGS DEPOSITED VIA INFRARED BURNERS

FIELD OF THE INVENTION

Certain example embodiments of this invention relate to the deposition of metal oxide coatings onto substrates via combustion deposition. More particularly, certain example embodiments relate to the deposition of metal oxide coatings onto substrates via combustion deposition using an infrared (IR) burner. In certain example embodiments, the metal oxide coating may be a silicon oxide coating (e.g., $SiO_2$, or other suitable stoichiometry) and, in certain example embodiments, the silicon oxide coating may serve as a single layer anti-reflective (SLAR or single layer AR) coating. In certain example embodiments, a visible transmission increase of at least about 1.7% may be realized through the substantially uniform deposition of the single layer AR coating on a first surface of the substrate.

BACKGROUND AND SUMMARY OF EXAMPLE EMBODIMENTS OF THE INVENTION

Combustion chemical vapor deposition (combustion CVD) is a relatively new technique for the growth of coatings. Combustion CVD is described, for example, in U.S. Pat. Nos. 5,652,021; 5,858,465; and 6,013,318, each of which is hereby incorporated herein by reference in its entirety.

Conventionally, in combustion CVD, precursors are dissolved in a flammable solvent and the solution is delivered to the burner where it is ignited to give a flame. Such precursors may be vapor or liquid and fed to a self-sustaining flame or used as the fuel source. A substrate is then passed under the flame to deposit a coating.

There are several advantages of combustion CVD over traditional pyrolytic deposition techniques (such as CVD, spray and sol-gel, etc.). One advantage is that the energy required for the deposition is provided by the flame. Another advantage is that combustion CVD techniques do not necessarily require volatile precursors. If a solution of the precursor can be atomized/nebulized sufficiently, the atomized solution will behave essentially as a gas and can be transferred to the flame without requiring an appreciable vapor pressure from the precursor of interest.

It will be appreciated that combustion deposition techniques may be used to deposit metal oxide coatings (e.g., singly-layer anti-reflective coatings) on glass substrates, for example, to alter the optical properties of the glass substrates (e.g., to increase visible transmission). To this end, conventional combustion deposition techniques were used by the inventors of the instant application to deposit a single layer anti-reflective (AR) film of silicon oxide (e.g., $SiO_2$ or other suitable stoichiometry). The attempt sought to achieve an increase in light transmission in the visible spectrum (e.g., wavelengths of from about 400-700 nm) over clear float glass with an application of the film on one or both sides. The clear float glass used in connection with the description herein is a low-iron glass known as "Extra Clear," which has a visible transmission typically in the range of 90.3% to about 91.0%. Of course, the examples described herein are not limited to this particular type of glass, or any glass with this particular visible transmission.

Figure 1A:
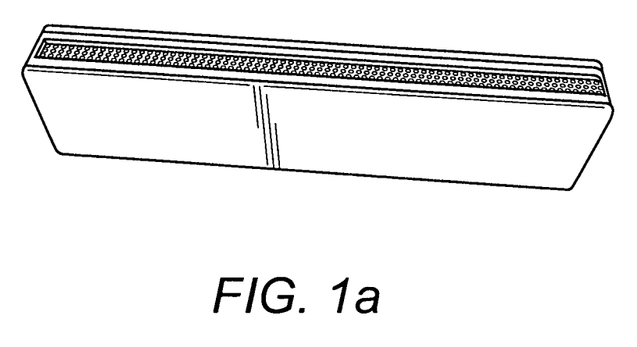
FIG. 1a shows a typical linear burner.
Figure 1B:
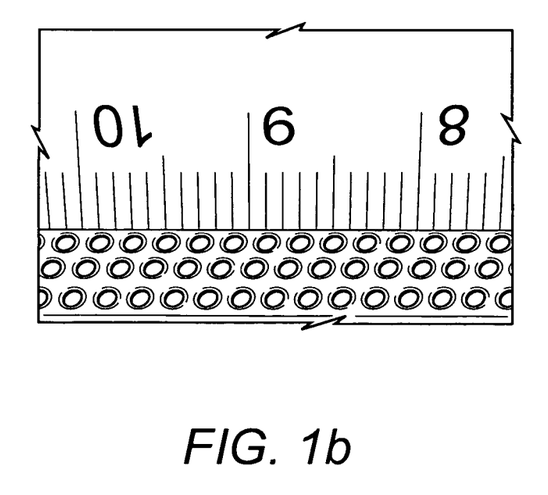

The combustion deposition development work was performed using a conventional linear burner with 465 holes even distributed in 3 rows over an area of 0.5 cm by 31 cm (155 holes per row). By way of example and without limitation, FIG. 1a shows a typical linear burner, and FIG. 1b is an enlarged view of the holes in the typical linear burner of FIG. 1a. As is conventional, the linear burner was fueled by a premixed combustion gas comprising propane and air. It is, of course, possible to use other combustion gases such as, for example, natural gas, butane, etc. The standard operating window for the linear burner involves air flow rates of between about 150 and 300 standard liters per minute (SLM), using air-to-propane ratios of about 15 to 25. Successful coatings require controlling the burner-to-lite distance to between about 10-50 mm when a linear burner is used.

Typical process conditions for successful films used a burner air flow of about 225 SLM, an air-to-propane ratio of about 19, four passes of the substrate across the burner, a burner-to-lite distance of 35 mm, and a glass substrate velocity of about 50 mm/sec.

Figure 2:
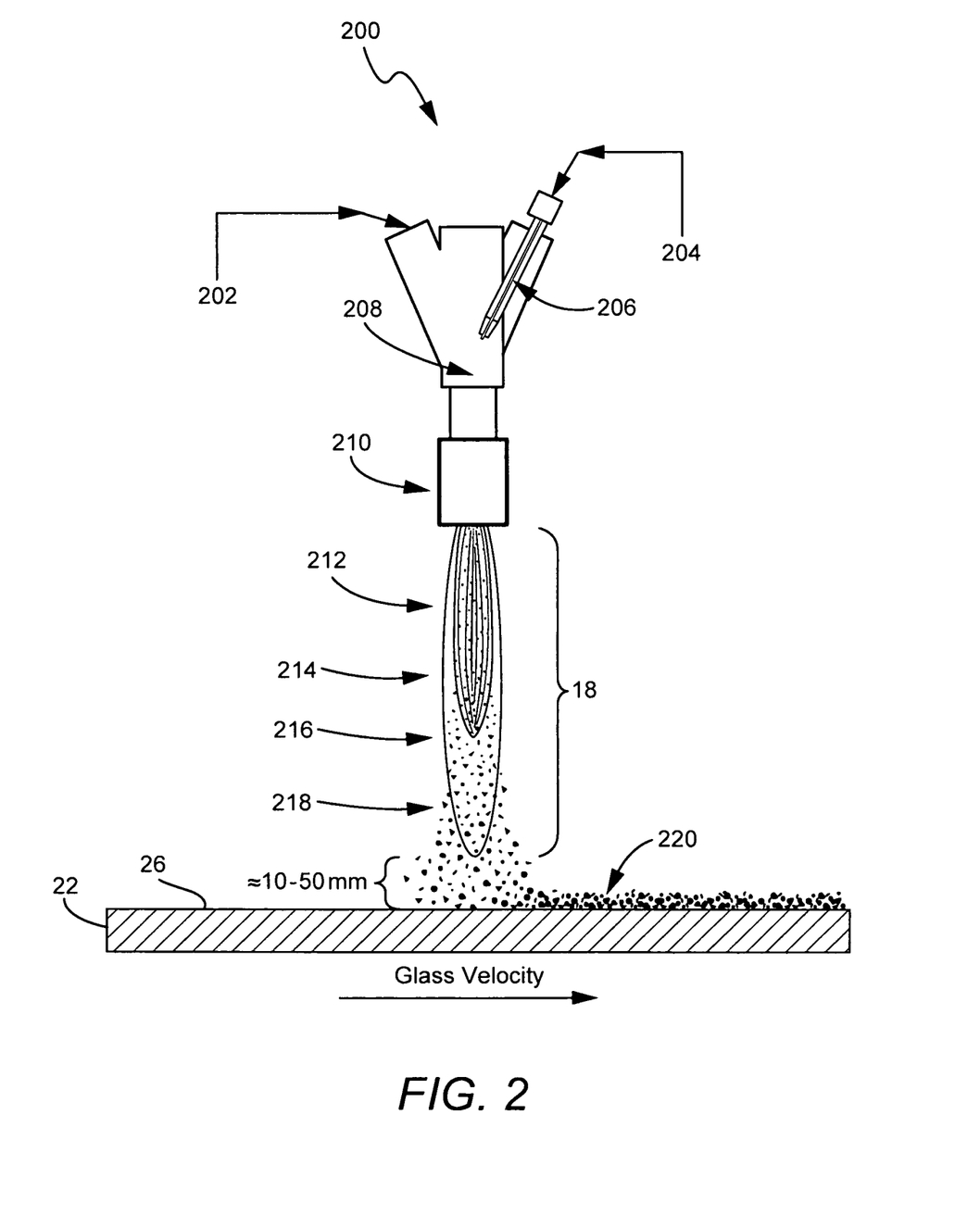
FIG. 2 is a simplified view of an apparatus including a linear burner used to carry out combustion deposition.

FIG. 2 is a simplified view of an apparatus 200 including a linear burner used to carry out combustion deposition. A combustion gas 202 (e.g., a propane air combustion gas) is fed into the apparatus 200, as is a suitable precursor 204 (e.g., via insertion mechanism 206, examples of which are discussed in greater detail below). Precursor nebulization (208) and at least partial precursor evaporation (210) occur within the apparatus 200. The precursor could also have been delivered as a vapor reducing or even eliminating the need for nebulization. The flame 18 may be thought of as including multiple areas. Such areas correspond to chemical reaction area 212 (e.g., where reduction, oxidation, and/or the like may occur), nucleation area 214, coagulation area 216, and agglomeration area 218. Of course, it will be appreciated that such example areas are not discrete and that one or more of the above processes may begin, continue, and/or end throughout one or more of the other areas.

Particulate matter begins forming within the flame 18 and moves downward towards the surface 26 of the substrate 22 to be coated, resulting in film growth 220. As will be appreciated from FIG. 2, the combusted material comprises non-vaporized material (e.g., particulate matter), which is also at least partially in particulate form when coming into contact with the substrate 22. To deposit the coating, the substrate 22 may be moved (e.g., in the direction of the velocity vector). Of course, it will be appreciated that the present invention is not limited to any particular velocity vector, and that other example embodiments may involve the use of multiple apparatuses 200 for coating different portions of the substrate 22, may involve moving a single apparatus 200 while keeping the substrate in a fixed position, etc. The flame 18 is about 10-50 mm from the surface 26 of the substrate 22 to be coated.

Unfortunately, the heat flux produced during combustion deposition creates a significant increase in substrate temperature. Also, heat is delivered to a smaller area (e.g., in comparison to the IR burners of certain example embodiments described below) causing much larger temperature gradients. Furthermore, the substrate temperature increases with smaller burner-to-lite distances and increasing numbers of passes. For example, using the process conditions identified above, the back side of the substrate was found to reach a temperature of 162° C. This equates to a linear estimate of temperature rate of rise of 71° C./burner/m/min.

The substrate temperature extremes and resultant thermal gradient experienced by the glass during deposition leads to stress changes in the glass. This phenomenon, in turn, has resulted in spontaneous glass fracture during coating, in post-coating cooling, and/or in subsequent deposition of the same film on the opposite side of the lite. Additionally, the glass experiences bowing, which ultimately leads to coating uniformity issues.

Thus, it will be appreciated that there is a need in the art for combustion deposition techniques that overcome one or more of these and/or other disadvantages, and/or improved techniques for depositing metal oxide coatings (single layer anti-reflective coatings) on glass substrates via combustion deposition.

In certain example embodiments of this invention, a method of forming a coating on a glass substrate using combustion deposition is provided. A glass substrate having at least one surface to be coated is provided. A reagent (and optionally, a carrier medium) is selected, and if a carrier medium is used, the reagent and the carrier medium are mixed together to form a reagent mixture. The reagent is selected such that at least a portion of the reagent is used in forming the coating. A precursor to be combusted with the reagent (or reagent mixture) is introduced. Using at least one infrared burner, at least a portion of the reagent (or reagent mixture) and the precursor are combusted to form a combusted material, with the combusted material comprising non-vaporized material. The glass substrate is provided in an area so that the glass substrate is heated sufficiently to allow the combusted material to form the coating, directly or indirectly, on the glass substrate.

In certain example embodiments, a fuel gas and oxygen source are selected and mixed together to form a combustion gas mixture. At least a portion of the combustion gas mixture is used in forming the coating. A precursor is selected such that at least a portion of the combustion products form a coating with desired properties. The precursor is introduced into the combustion gas stream to form a reagent mixture. Using at least one infrared burner, at least a portion of the reagent mixture is reacted via combustion to form reaction products, with at least a portion of the reaction products comprising non-vaporized material.

In certain example embodiments, a method of applying a coating to a substrate using combustion deposition is provided. A substrate having at least one surface to be coated is provided. A reagent (and optionally, a carrier medium) is selected, and if a carrier medium is selected, the reagent and the carrier medium are mixed together to form a reagent mixture, with the reagent being selected such that at least a portion of the reagent forms the coating. A precursor to be combusted with the reagent (or reagent mixture) is introduced, with the precursor including silicon. Using at least one infrared burner, at least a portion of the reagent (or reagent mixture) and the precursor are combusted to form a combusted material. The substrate is provided in an area so that the substrate is heated sufficiently to allow the combusted material to form the coating, directly or indirectly, on the substrate. The deposited coating comprises silicon oxide. The coating increases visible transmission of the glass substrate by at least about 1.7%.

In certain example embodiments, a method of applying a coating to a substrate using combustion deposition is provided. A substrate having at least one surface to be coated is provided. A reagent (and optionally, a carrier medium) is selected, and if a carrier medium is selected, and the reagent and the carrier medium are mixed together to form a reagent mixture, with the reagent being selected such that at least a portion of the reagent forms the coating. A precursor to be combusted with the reagent (or reagent mixture) is introduced, with the precursor including silicon. Via IR radiation from an IR radiation source, the IR radiation having a wavelength of about 2.5-3.5 microns distributed substantially two-dimensionally, at least a portion of the reagent (or reagent mixture) and the precursor are combusted to form a combusted material, the combusted material comprising non-vaporized material. The glass substrate is provided in an area about 2-5 mm from IR radiation source so that the glass substrate is heated sufficiently to allow the combusted material to form the coating substantially uniformly, directly or indirectly, on the glass substrate. The coating is substantially uniform.

In certain example implementations, the substrate temperature is heated to a temperature lower than that of conventional CVD and/or a lower temperature flame is used to combust the material to be combusted. In certain example implementations, the coating may be applied in a substantially uniform manner (e.g., across two dimensions), as measured by variations in thickness of the coating (e.g., with variations not exceeding about ±10%) and/or variations in the visible transmission gain (e.g., with variations in either percent transmission or percent transmission gain not exceeding about ±0.5%).

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 1b is an enlarged view of the holes in the typical linear burner of FIG. 1a;

DETAILED DESCRIPTION OF EXAMPLE EMBODIMENTS OF THE INVENTION

In certain example embodiments of this invention, a method of forming a coating on a glass substrate using combustion deposition is provided. A glass substrate having at least one surface to be coated is provided. A reagent and an optional carrier medium are selected, and the reagent and the carrier medium are mixed together to form a reagent mixture. The reagent is selected such that at least a portion of the reagent is used in forming the coating. A precursor to be combusted with the reagent mixture is introduced. Using at least one infrared burner, at least a portion of the reagent mixture and the precursor are combusted to form a combusted material, with the combusted material comprising non-vaporized material. The glass substrate is provided in an area so that the glass substrate is heated sufficiently to allow the combusted material to form the coating, directly or indirectly, on the glass substrate. The coating may be applied in a substantially uniform manner (e.g., across two dimensions), as measured by variations in thickness of the coating and/or variations in the visible transmission gain. In the case of depositing a SLAR coating comprising silicon oxide, the coating may increase visible transmission of the glass substrate by at least about 1.7%.

In certain example embodiments, a fuel gas and oxygen source are selected and mixed together to form a combustion gas mixture. At least a portion of the combustion gas mixture is used in forming the coating. A precursor is selected such that at least a portion of the combustion products form a coating with desired properties. The precursor is introduced into the combustion gas stream to form a reagent mixture. Using at least one infrared burner, at least a portion of the reagent mixture is reacted via combustion to form reaction products, with at least a portion of the reaction products comprising non-vaporized material.

As noted above, it would be advantageous to deposit single layer anti-reflective (AR) coatings on glass substrates, for example, to increase the visible transmission of the glass substrates that mitigate one or more of the above and/or other disadvantages associated with conventional combustion deposition techniques. Thus, certain example embodiments implement an alternative type of burner as an in heat management during coating deposition in the overall combustion deposition process. In certain example embodiments, the alternative burner is an infrared (IR) burner. For example, an IR burner manufactured by the Maxon Corporation under the trade name RadMax (Type 13) may be used in connection with certain example embodiments.

The IR burner of certain example embodiments operates with very little visible flame, and sometimes even no visible flame at all in certain example embodiments, and irradiates infrared wavelength radiation from the burner faceplate that is heated by the combustion process. It will be appreciated that as the heater surface temperature increases, the wavelength of the radiant energy generated decreases. To increase the efficiency from the radiant heater, a wavelength of infrared that will be absorbed by the product to be heated may be used.

More precisely, the IR burner shifts the radiation emission towards the IR region. The combustion process heats the face plate surface which emits IR as function of temperature. In general, the hotter the faceplate the shorter the wavelength. The range of wavelengths possible extends from about 2 microns to about 11 microns and, more particularly, from about 2.5-3.5 microns. This corresponds to an emitter surface temperature range of from about 500° C.-900° C. Generally the wavelength is selected based upon the absorption of the materials to be heated. For example, a first range for wavelengths of infrared that tends to be most readily absorbed by water includes radiation from about 5.3-7 microns, corresponding to an emitter surface temperature range from about 140-270° C. A second range is from about 2.55-2.9 microns, corresponding to an emitter surface temperature range from about 720-870° C. Of course, it will be appreciated that the wavelengths and/or emitter surface temperatures may be adjusted, for example, in dependence on the reagents, solutions, precursors, etc., so as to increase efficiency of the coating process.

The IR burner comprises a sintered metal or ceramic face plate. The advantages associated with using a sintered metal or ceramic face plate are described in greater detail below. In general, IR burners have been found to distribute heat over a much larger area than linear burners. For example, the Maxon IR burner identified above has been an operating combustion area of 7.7 cm wide by 37.7 cm long. Thus, the deposition occurs substantially two-dimensionally, which can be contrasted with the conventional linear technique. Although the number of rows of holes used in a linear burner theoretically could be increased to provide more two-dimensional deposition, the amount of heat introduced to the substrate likely would be too high, and thus certain substrates would not survive the coating process (for example, if hole size is maintained and rows are expanded, then the flow rate would have to be increased to maintain the flame and prevent flashback, which would lead to higher substrate temperatures; and if the hole size is decreased as rows increase such that the total flow area remains roughly constant, then the flow rate could be kept the same and flame characteristics may begin to approach that of an IR burner although the burner would no longer be linear). With this particular example configuration, two or more IR burner modules may be used simultaneously to fit the control system limitations of the particular gas train unit, for example, in terms of overall combustion gas flow rate. However, it will be appreciated that the present invention is not so limited. Indeed, a gas train could be configured that would enable the use flow rates such that any reasonable number of burners or burner designs could be used. Thus, by way of example and without limitation, a single IR burner module may have a width of about 1.5-3.7 m in certain example embodiments, thereby reducing the need for multiple IR burner modules.

Similar to the conventional linear burners, the IR burner of certain example embodiments also uses a premixed combustion gas (e.g., comprising propane and air). However, the amount of fuel required to successfully operate the IR burner of certain example embodiments is lower than the conventional linear burner. In particular, the stable operating window for the IR burner of certain example embodiments involves air flow rates preferably of about 100-350 SLM and more preferably about 125-325 SLM. Similarly, the preferable air-to-propane ratios are about 15-35 and more preferably 20-30.

Silicon oxide (e.g., $SiO_2$ or other suitable stoichiometry) films made with the IR burner of certain example embodiments may use the precursor hexamethyldisiloxane (HMDSO). Other precursors, such as tetraethylorthosilicate (TEOS), silicon tetrachloride (e.g., $SiCl_4$ or other suitable stoichiometry), and the like, may be used. Of course, it will be appreciated that other metal oxide precursors may be used, for example, as the invention is not limited to deposition of silicon dioxide films.

Advantageously, successful coatings with the IR burner of certain example embodiments may be provided using much smaller burner-to-lite distances than that of many conventional linear burners (e.g., although linear burners have tried using smaller burner-to-substrate gaps to deposit coatings, at these distances with certain substrates (e.g., glass substrates), the even higher temperatures and larger temperature gradients involved at these distances are problematic). The distances used in connection with the IR burner of certain example embodiments preferably are within the range of about 1-7 mm and more preferably about 2-5 mm. Also advantageous is that the heat flux produced during coating is much lower with the IR burner. It will be appreciated that burner-to-lite distance impacts films. For example, larger burner-to-lite distances result in powders be generated rather than films.

In one example, the process conditions for successfully producing films using two IR burners simultaneously involved a burner air flow of 175 SLM, an air-to-propane ratio of 24, four passes (with two burners per pass), a burner-to-lite distance of 3 mm, and a glass substrate velocity of 50 mm/sec, with an HDMSO concentration of 0.018%.

Using these process conditions, the back side of the substrate reached a temperature of only 111° C. This equates to a linear estimate of temperature rate of rise of 16.5° C./burner/m/min, which is nominally 25% of the rate of rise observed with the linear burner. Accordingly, there is also a corresponding reduced heat flux per unit area. In certain example embodiments, the IR burner may be tuned such that the visible flame is reduced in size and thermal gradients generally are only evident by visible variations in gas density.

Using the above described techniques, the combusted material forming on the glass substrate (either directly or indirectly) comprises at least some particulate matter. That is, at least some of the combusted material to be deposited on the surface of the substrate is non-vaporized material. The presence of some particulate matter was detected by measuring the haze value of the glass before and after wiping the glass substrate. Additionally, some particulate matter is embedded into the film. It will be appreciated that the amount and size distribution of particulate matter hitting the substrate may be reduced, for example, by reducing the concentration of precursor in the flame. However, it also would be appreciated that this process would be too slow for practical manufacturing purposes. Thus, in certain example embodiments, following deposition of the material onto the substrate, the substrate may be wiped and/or washed in a cleaning process to reduce the particulate matter formed on the substrate that is not continuous with the film.

As noted above, using a sintered metal or ceramic faceplate in connection with the IR burners of certain example embodiments is advantageous. For example, using a sintered metal or ceramic faceplate in connection with the IR burners enables the coating to be provided in a substantially uniform distribution, e.g., in two dimensions on the glass substrate. The uniformity of the distribution may be measured, for example, in terms of uniformity of thickness and/or visible transmission. Preferably, the thickness of the coating will vary by no more than about ±15%, more preferably by no more than about ±10%, and still more preferably no by more than about ±5%. For optical coatings, preferably, the visible transmission will vary by no more than ±2%, more preferably by no more than about ±1%, and still more preferably by no more than about ±0.5%.

In terms of the actual thickness of the deposited coating, most deposited optical single-layer AR coatings of silicon oxide will be within the range of about 80-120 nm. More preferably, most coatings deposited will be about 100 nm thick. Of course, there are many other materials that may be used for coatings for similar and/or other product applications. The example embodiments described herein may be used to boost the visible transmission preferably by about 1.7%, more preferably by about 2.5%, and still more preferably by at least about 3.0%. In certain example embodiments, the coatings may be applied to one or both sides of the glass substrate. Thus, providing coatings conveying 3.0% visible transmission gains to both sides of a clear float glass substrate with a base visible transmission of about 91% advantageously may result in a total visible transmission of about 97%. Of course, the present invention is not limited to the dual-side coating, the use in connection with clear float glass, or the 3.0% visible transmission gain of the coating, or silicon dioxide films.

Certain example embodiments also may provide enhanced AR features by reducing the index of refraction of the silicon dioxide coating, e.g., so as to create a voided film through the introduction of more air. Bulk silicon dioxide typically has an index of refraction of from about 1.45-1.50. Certain example embodiments may reduce the index of refraction of the films to about 1.40, more preferably to about 1.35-1.38, and still more preferably to about 1.30-1.33 or even lower.

Figure 3:
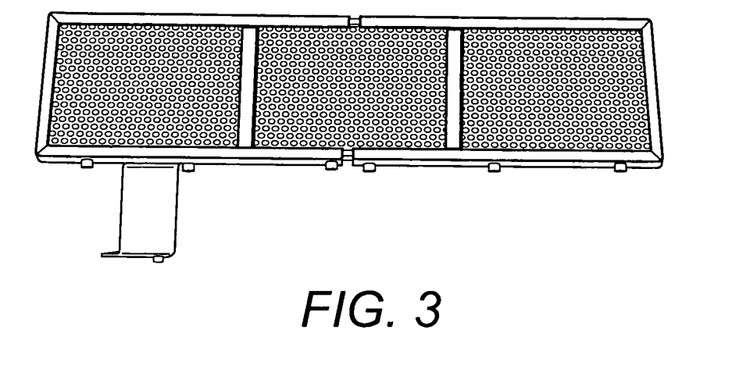
FIG. 3 shows a typical IR burner module that may be used to carry out combustion deposition in accordance with an example embodiment.
Figure 4:
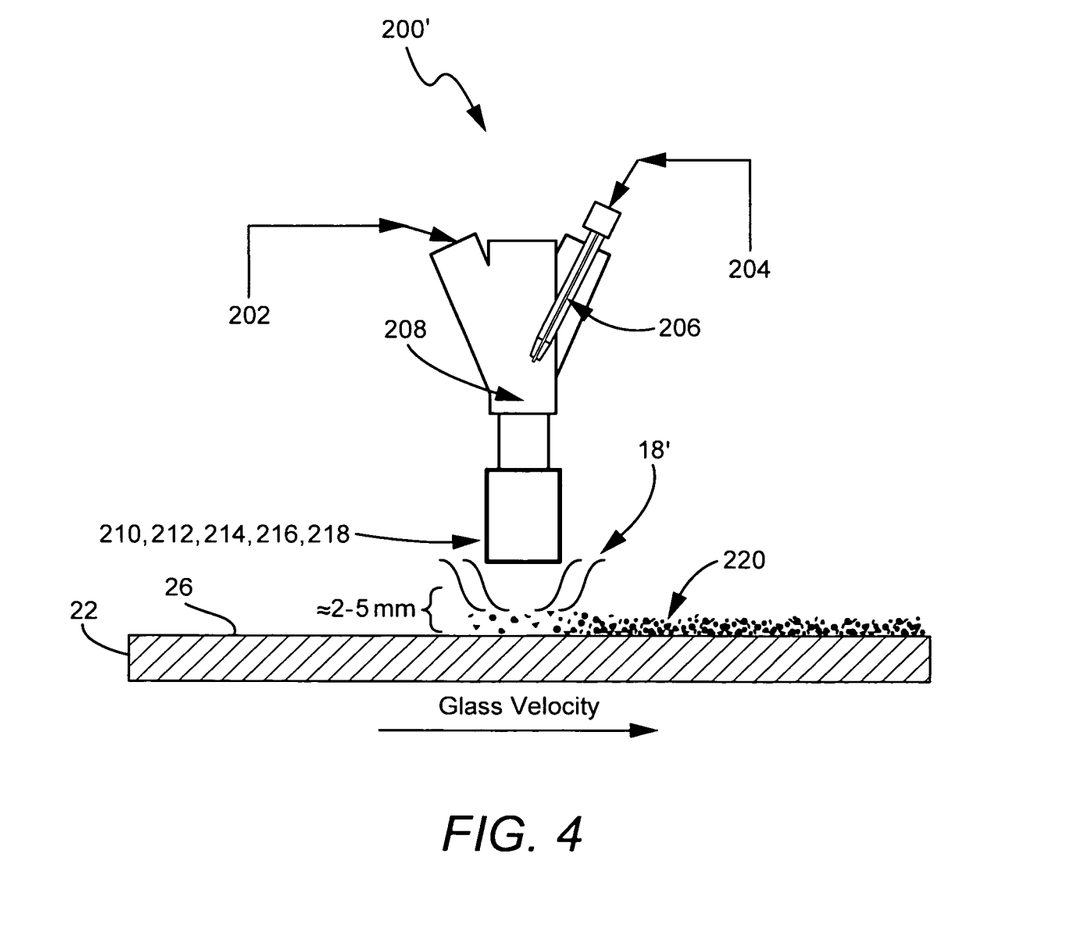
FIG. 4 is a simplified view of an improved apparatus including an infrared burner used to carry out combustion deposition in accordance with an example embodiment.

FIG. 3 shows a typical IR burner module that may be used to carry out combustion deposition in accordance with an example embodiment. FIG. 4 is a simplified view of an improved apparatus 200' including an infrared burner used to carry out combustion deposition in accordance with an example embodiment. The improved apparatus 200' shown in FIG. 4 is similar to the apparatus 200' shown in FIG. 2, except that the improved apparatus 200' includes an IR burner (e.g., one or more of the IR burner modules shown in FIG. 3). Thus, radiant energy 18' performs the coating, and the existence of a visible flame is reduced. The surface 26 of the substrate 22 to be coated is located much closer to the apparatus. For example, in FIG. 4, the surface 26 of the substrate 22 to be coated is located only about 2-5 mm from the apparatus. Accordingly, the reaction steps 210-218 occur within a much smaller distance. Additionally, the improved apparatus 200' is configured to provide a substantially two-dimensional coating area, which is substantially uniform.

Figure 5:
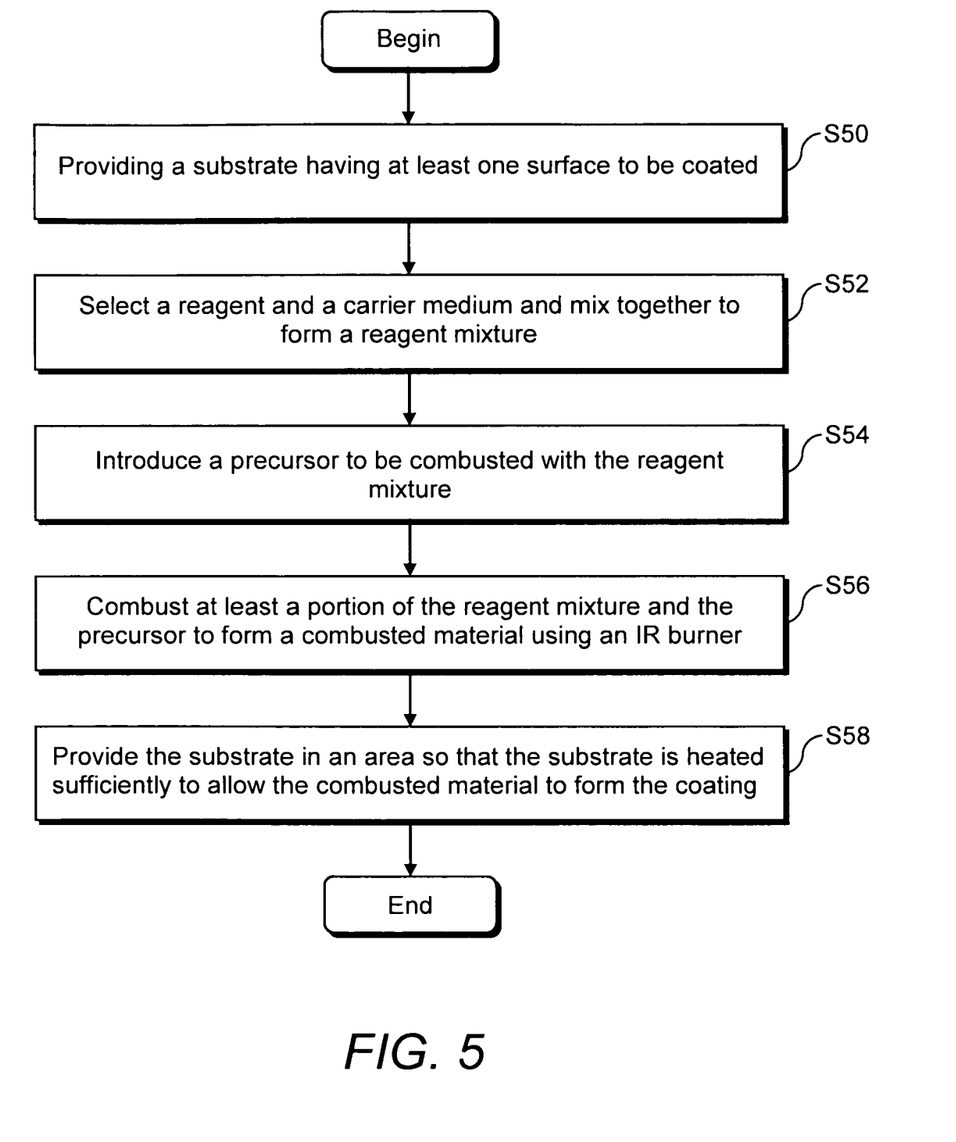
FIG. 5 is an illustrative flowchart illustrating a process for applying a single layer anti-reflective coating to a glass substrate using combustion deposition using an infrared burner in accordance with an example embodiment.

FIG. 5 is an illustrative flowchart illustrating a process for applying a single layer anti-reflective coating to a glass substrate using combustion deposition using an infrared burner in accordance with an example embodiment. In step S50, a substrate (e.g., a glass substrate) having at least one surface to be coated is provided. A reagent and a carrier medium are selected and mixed together to form a reagent mixture in step S52. The reagent is selected so that at least a portion of the reagent forms the coating. A precursor to be combusted with the reagent mixture is introduced in step S54. In step S56, at least a portion of the reagent mixture and the precursor are combusted using an IR burner, thereby forming a combusted material. The precursors may be introduced by a number of means. For example, the precursors may be introduced in a vapor state via a bubbler, as large particle droplets via an injector, and/or as small particle droplets via a nebulizer. The combusted material comprises non-vaporized material (e.g., at least some particulate matter). In step S58, the substrate is provided in an area so that the substrate is heated sufficiently to allow the combusted material to form the coating on the substrate. The coating may be formed either directly or indirectly on the substrate. Optionally, in a step not shown, the opposing surface of the substrate also may be coated. Also optionally, the substrate may be wiped and/or washed, e.g., to remove excess particulate matter deposited thereon.

The example techniques described herein are advantageous for several reasons. For example, the IR burners of certain example embodiments reduce the substrate temperatures during deposition, which leads to a reduced amount of changes in the glass stress, and/or a reduced propensity for the glass to break during deposition and/or in post-coating processing. As alluded to above, too much heat may lead to breakage and/or deformation of the glass substrate (e.g., causing the glass substrate to deform in a convex up or concave down manner), caused in part by residual stresses left in glass. In a similar vein, the heat flux from the IR burners of certain example embodiments may be distributed across a much larger area, thereby reducing the thermal gradients that lead to stress-induced glass fracture. Additionally, certain example embodiments provide the ability to increase the separation of the substrate temperature effect from the combustion process on film growth processes at the substrate surface. Reducing the coupling of the substrate temperature to the combustion reactor process, in turn, may provide improved ability for process control and may also result in less variable film performance.

Furthermore, because the IR burners of certain example embodiments require less fuel, fuel usage costs may be reduced. There also may be reduced post-deposition glass cooling costs (e.g., because the substrate does not become as hot, because fewer substrates are lost because of breakage and/or deformation, etc.). The flames produced by the IR burners of certain example embodiments tend to be more uniform than with the linear burner, as observed by the reduced amount of visible movement in the combustion zone. Finally, the IR burners of certain example embodiments may be more easily maintained because the design allows for easy disassembly and cleaning. It will be appreciated that maintainability often is a component of the burner design for the manufacturability of combustion deposition coating applications.

It will be appreciated that the techniques described herein can be applied to a variety of metal oxides, and that the present invention is not limited to any particular type of metal oxide deposition and/or precursor. For example, oxides of the transition metals and lanthanides such as, for example, Y, Ti, Zr, Hf, V, Nb, Ta, Cr, Mo, W, La, Ce, Cr, Mo, W, Mn, Fe, Ru, Co, Ir, Ni, Cu, and main group metals and metalloids such as, for example, Zn, Cd, B, Al, Ga, In, Si, Ge, Sn, Sb and Bi, and mixtures thereof can all be deposited using the IR burner technology of certain example embodiments.

It will be appreciated that the foregoing list is provided by way of example. For example, the metal oxides identified above are provided by way of example. Any suitable stoichiometry similar to the metal oxides identified above may be produced. Additionally, other metal oxides may be deposited, other precursors may be used in connection with these and/or other metal oxide depositions, the precursor delivery techniques may be altered, and/or that other potential uses of such coatings may be possible.

It also will be appreciated that the techniques of the example embodiments described herein may be applied to a variety of products. That is, a variety of products potentially may use these and/or other AR films, depending in part on the level of transmission gain that is obtained. Such potential products include, for example, photovoltaic, green house, sports and roadway lighting, fireplace and oven doors, picture frame glass, etc. Non-AR products also may be produced.

The example embodiments described herein may be used in connection with multiple layer AR coatings, as well. By way of example and without limitation, multiple reagents and/or precursors may be selected to provide coatings comprising multiple layers.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of forming an anti-reflective coating on a glass substrate using combustion deposition, the method comprising:
   providing a glass substrate having at least one surface to be coated;
   selecting a reagent, the reagent being selected such that at least a portion of the reagent is used in forming the coating;
   introducing a precursor to be combusted with the reagent;
   combusting, using at least one infrared burner, at least a portion of the reagent and the precursor to form a combusted material, the combusted material comprising non-vaporized material;
   providing the glass substrate at a distance of about 2-5 mm from the at least one IR burner and in an area so that the glass substrate is heated sufficiently to allow the combusted material to form the anti-reflective coating, directly or indirectly, on the glass substrate; and
   providing a linear estimate of substrate temperature rate of rise of only about 16.5° C./burner/m/min.

2. The method of claim 1, wherein the coating comprises an oxide of silicon.

3. The method of claim 2, wherein the precursor is hexamethyldisiloxane.

4. The method of claim 2, wherein the precursor is tetraethylorthosilicate or silicon tetrachloride.

5. The method of claim 2, wherein the coating is about 80-120 nm thick.

6. The method of claim 1, wherein the coating is substantially uniform.

7. The method of claim 6, wherein the uniformity of the coating is measured by thickness, the thickness of the coating not varying by more than about 10%.

8. The method of claim 6, wherein the uniformity of the coating is measured by visible transmission, the visible transmission of the coating not varying by more than about 0.5%.

9. The method of claim 1, wherein the combusting includes using a fuel comprising a mixture of oxygen and propane.

10. The method of claim 1, further comprising depositing at least one additional coating via combustion deposition on a second surface of the glass substrate.

11. The method of claim 1, wherein the coating increases visible transmission of the glass substrate by at least about 3.0%.

12. The method of claim 1, further comprising providing IR radiation at a wavelength of about 2.5-3.5 microns to cause the combusting.

13. The method of claim 1, further comprising providing fuel at an air flow rate of about 125-325 standard liters per minute.

14. The method of claim 1, further comprising reducing the glass substrate index of refraction to about 1.35-1.38.

15. A method of applying a coating to a substrate using combustion deposition, the method comprising:
   providing a substrate having at least one surface to be coated;
   selecting a reagent, the reagent being selected such that at least a portion of the reagent forms the coating;
   introducing a precursor to be combusted with the reagent, the precursor including silicon;
   combusting, using at least one infrared burner, at least a portion of the reagent and the precursor to form a combusted material; and
   providing the substrate in an area so that the substrate is heated sufficiently to allow the combusted material to form the coating, directly or indirectly, on the substrate, wherein a linear estimate of substrate temperature rate of rise is only about 16.5° C/burner/m/min;
   wherein the deposited coating comprises silicon oxide, and
   wherein the coating is substantially uniform and increases visible transmission of the glass substrate by at least about 1.7%.

16. The method of claim 15, wherein the precursor is hexamethyldisiloxane.

17. The method of claim 15, wherein the precursor is tetraethylorthosilicate or silicon tetrachloride.

18. The method of claim 15, further comprising providing the substrate at a distance of about 2-5 mm from the at least one IR burner.

19. The method of claim 15, further comprising providing IR radiation at a wavelength of about 2.5-3.5 microns to cause the combusting.

20. The method of claim 15, further comprising reducing the glass substrate index of refraction to about 1.35-1.38.

21. A method of forming a coating on a glass substrate using combustion deposition, the method comprising:

providing a glass substrate having at least one surface to be coated;

selecting a reagent, the reagent being selected such that at least a portion of the reagent is used in forming the coating;

introducing a precursor to be combusted with the reagent;

combusting, via IR radiation from an IR radiation source, the IR radiation having a wavelength of about 2.5-3.5 microns distributed substantially two-dimensionally, at least a portion of the reagent and the precursor to form a combusted material, the combusted material comprising non-vaporized material; and providing the glass substrate in an area about 2-5 mm from the IR radiation source so that the glass substrate is heated sufficiently to allow the combusted material to form the coating substantially uniformly, directly or indirectly, on the glass substrate, wherein the substrate is heated to a temperature less than that to which a substrate would be heated if a combustion deposition burner that was not an IR burner were used; and wherein the coating is substantially uniform.

* * * * *